United States Patent
Sanji (10) Patent No.: US 12,108,538 B2
(45) Date of Patent: Oct. 1, 2024

(54) COMPONENT TYPE MANAGEMENT DEVICE

(71) Applicant: FUJI CORPORATION, Chiryu (JP)

(72) Inventor: Mitsuru Sanji, Toyota (JP)

(73) Assignee: FUJI CORPORATION, Chiryu (JP)

( * ) Notice: Subject to any disclaimer, the term of this patent is extended or adjusted under 35 U.S.C. 154(b) by 489 days.

(21) Appl. No.: 17/429,050

(22) PCT Filed: Feb. 12, 2019

(86) PCT No.: PCT/JP2019/004885
§ 371 (c)(1),
(2) Date: Aug. 6, 2021

(87) PCT Pub. No.: WO2020/165955
PCT Pub. Date: Aug. 20, 2020

(65) Prior Publication Data
US 2022/0132716 A1    Apr. 28, 2022

(51) Int. Cl.
*H05K 13/08*    (2006.01)

(52) U.S. Cl.
CPC ..... *H05K 13/0882* (2018.08); *H05K 13/0815* (2018.08); *H05K 13/086* (2018.08)

(58) Field of Classification Search
CPC ........... H05K 13/0882; H05K 13/0815; H05K 13/086; H05K 13/0417; H05K 13/021
See application file for complete search history.

(56) References Cited

U.S. PATENT DOCUMENTS

2015/0033555 A1* 2/2015 Mizokami ............ H05K 13/085
                                                    29/832
2016/0128246 A1* 5/2016 Kubota ................ H05K 13/043
                                                    29/739
(Continued)

FOREIGN PATENT DOCUMENTS

JP    2001-127487 A    5/2001
JP    2005-216946 A    8/2005
(Continued)

OTHER PUBLICATIONS

International Search Report mailed on May 14, 2019 in PCT/JP2019/004885 filed on Feb. 12, 2019 (1 page).
(Continued)

*Primary Examiner* — Thomas C Lee
*Assistant Examiner* — Tyler Dean Hedrick
(74) *Attorney, Agent, or Firm* — Oblon, McClelland, Maier & Neustadt, L.L.P.

(57) ABSTRACT

A component type management device includes an association registration section configured to register association data in which individual identification information of a component supply device which is attached to a component mounter and supplies a component is associated with a type of the component held in the component supply device, an association discarding section configured to discard the association data in a case where a predetermined condition is satisfied after the component supply device is detached from the component mounter, a detachment discrimination section configured to discriminate whether the component supply device is detached by an automatic exchanging device; and an association maintaining section configured to invalidate a function of the association discarding section before the predetermined condition is satisfied and maintain the association data in a case of being discriminated that the (Continued)

component supply device is detached by the automatic exchanging device.

5 Claims, 3 Drawing Sheets

(56) References Cited

U.S. PATENT DOCUMENTS

2017/0208713 A1* 7/2017 Iisaka ................. H05K 13/086
2018/0049354 A1* 2/2018 Honda ................... G06Q 50/04
2020/0344926 A1* 10/2020 Higashino .......... H05K 13/0417

FOREIGN PATENT DOCUMENTS

| JP | 2017118007 A * | 6/2017 | ............ H05K 13/02 |
| WO | WO 2012/063625 A1 | 5/2012 | |
| WO | WO 2014/128861 A1 | 8/2014 | |
| WO | WO 2018/142532 A1 | 8/2018 | |

OTHER PUBLICATIONS

English translation of Japanese Office Action issued Jan. 9, 2024 in Japanese Application 2023-089478, 3 pages.

* cited by examiner

COMPONENT TYPE MANAGEMENT DEVICE

TECHNICAL FIELD

The present description relates to a component type management device that manages a type of a component held in a component supply device attached to a component mounter.

BACKGROUND ART

A technique of mass-producing board products by performing a board work on a board on which printed wiring is performed has become widespread. A typical example of a board work machine for performing the board work is a component mounter that performs a component mounting work. Generally, a component supply device such as a feeder attached to the component mounter is managed by being given individual identification information. Furthermore, the type of the component held in the component supply device is managed by associating with the individual identification information of the component supply device. A technical example that manages the individual identification information of the component supply device and information on the type of the held component is disclosed in Patent Literature 1.

A component remaining number management method of a component mounter disclosed in Patent Literature 1 stores a feeder ID (individual identification information) for identifying a feeder, a component ID for identifying the type of a component to be supplied, and the component remaining number in association with each other. When the feeder is attached to the component mounter, in a case where a combination of the feeder ID and the component ID regarding the feeder is not stored, the combination is stored, whereas in a case where the combination is stored, the information of the component remaining number is used. Accordingly, the component remaining number of each feeder can be easily managed.

PATENT LITERATURE

Patent Literature 1: JP-A-2005-216946

BRIEF SUMMARY

Technical Problem

Incidentally, in the component mounter, multiple feeders each loaded with a reel are attached side by side. Then, in a setup changing work when changing the type of the board product to be produced, a first case occurs in which the feeder is temporarily detached and an arrangement position is changed. In addition, after the feeder is detached the reel is exchanged, so that a second case occurs in which the type of the held component is changed.

Here, a control section for associating the feeder ID and the component ID in Patent Literature 1 needs to maintain the association in the first case and discard the association in the second case. As a simple method of discriminating the first case and the second case, a discriminating method using a duration of the detached state is used. That is, since the duration of the detached state is short in the first case and the duration of the detached state is long in the second case, two cases are discriminated.

In recent years, an automatic exchanging device for automatically exchanging a feeder has been put into practical use in response to demands for labor saving and automation of production. However, full automation is difficult to realize, and sometimes manual exchange is used together. In addition, there is a line configuration in which a new type of the component mounter to which an automatic exchanging device corresponds and an old type of the component mounter relying on manual exchange are used together. Here, the automatic exchanging device manages the feeder detached from the component mounter, and does not allow the exchange of the reel. Therefore, in a range where the automatic exchanging device is applied, it is unnecessary to discard the association between the feeder ID and the component ID.

In other words, the related art such as Patent Literature 1 does not function appropriately for the automatic exchange of the feeder. That is, even if the feeder is automatically detached by the automatic exchanging device, when the duration of the detached state becomes long, the association is discarded. As a result, when the automatic exchanging device re-attaches the feeder device to the component mounter, an operator needs to re-register the association, and it takes efforts twice. In addition, in a case where the operator fails to re-register, an error occurs.

An object of the present description is to provide a component type management device which appropriately functions for both automatic exchange and manual exchange of a component supply device and can appropriately manage a type of a component held in the component supply device.

Solution to Problem

The present description discloses a component type management device including an association registration section configured to register association data in which individual identification information of a component supply device which is attached to a component mounter and supplies a component is associated with a type of the component held in the component supply device, an association discarding section configured to discard the association data in a case where a predetermined condition is satisfied after the component supply device is detached from the component mounter, a detachment discrimination section configured to discriminate whether the component supply device is detached by an automatic exchanging device; and an association maintaining section configured to invalidate a function of the association discarding section before the predetermined condition is satisfied and maintain the association data in a case of being discriminated that the component supply device is detached by the automatic exchanging device.

Advantageous Effects

In the component type management device disclosed in the present description, the detachment discrimination section discriminates whether the component supply device is detached by the automatic exchanging device, and in a case where the component supply device is automatically detached, the association maintaining section functions to maintain the association data. Therefore, it is unnecessary for the operator to re-register the association data, and there is no risk of errors. In addition, in a case where the component supply device is manually detached, the association discarding section functions to discard the association data when a predetermined condition is satisfied. Therefore, there is no risk of an error caused by continuing to maintain the association data with respect to the possibility that the type of the component held in the component supply device is changed. Accordingly, the component type management device functions appropriately for both the automatic exchange and the manual exchange of the component supply device, and the type of the component held in the component supply device can be appropriately managed.

DESCRIPTION OF EMBODIMENTS

1. Configuration Example of Component Mounting System 9

Figure 1:
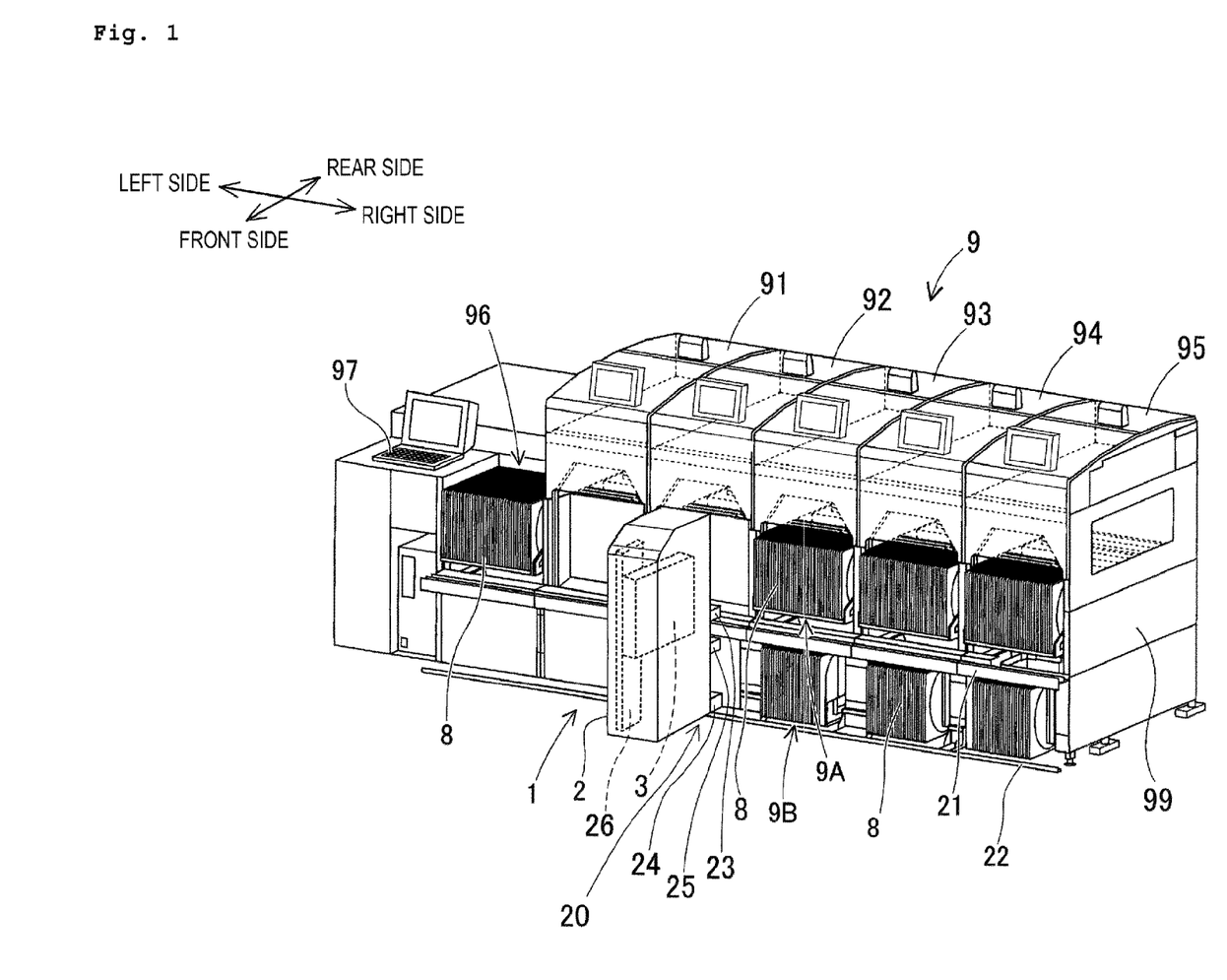
FIG. 1 is a perspective view illustrating a configuration example of a component mounting system in which a component type management device according to an embodiment is incorporated.

First, a configuration example of component mounting system 9 in which component type management device 5 (refer to FIG. 2) of the embodiment is incorporated will be described. Component mounting system 9 mounts a component to a board to produce a board product. As illustrated in FIG. 1, the front, rear, left, and right sides of component mounting system 9 are defined for convenience. Component mounting system 9 includes multiple board work machines arranged in a row in a left-right direction. That is, solder printer 91, printing inspection machine 92, first component mounter 93, second component mounter 94, third component mounter 95, board appearance inspection machine (not illustrated), and a reflow machine (not illustrated) are arranged in a row from the left side to the right side.

Each of the board work machines performs a predetermined work on the board, that is, the board work. Specifically, solder printer 91 prints a paste-like solder in a defined pattern shape on the board. Printing inspection machine 92 images and inspects the board in a solder printed state. First component mounter 93, second component mounter 94, and third component mounter 95 pick up the component from component supply section 9A, and mount the component on the solder of the board. The board appearance inspection machine images the component mounted on the board and inspects an appearance state. The reflow machine ensures soldering of the component by heating and cooling the solder. The board work is not limited to the above-described work contents and includes accompanying work and the like. For example, a convey-in/out work and a positioning work of the board, and a checking work for detecting positions and orientations of the board and the component by imaging them are also included in the board work.

First component mounter 93, second component mounter 94, and third component mounter 95 have the same structure. Component mounters (93, 94, 95) include component supply section 9A, spare feeder storage section 9B, a board conveyance device (not illustrated in FIG. 1), and a component transfer device.

Component supply section 9A is disposed at a substantially intermediate height on the front side of machine table 99. Component supply section 9A has multiple slots that extend in a front-rear direction and are formed parallel with each other at a predetermined pitch. Feeder 8 is inserted into and attached to each slot of component supply section 9A. That is, multiple feeders 8 are arranged side by side in the left-right direction in FIG. 1. Feeder 8 is an example of a component supply device.

Spare feeder storage section 9B is disposed below component supply section 9A on the front side of machine table 99. Spare feeder storage section 9B also has multiple slots that extend in the front-rear direction and are formed parallel to each other at a predetermined pitch. In the slots of spare feeder storage section 9B, spare feeder 8 for which a setup work has been completed and used feeder 8 are arranged and temporarily stored. The board conveyance device carries in, positions, and carries out the boards. The component transfer device picks up the component from component supply section 9A using a component mounting tool, such as a suction nozzle, and mounts the component on the board.

Feeders 8 are detachably attached to component supply section 9A and spare feeder storage section 9B. Feeder 8 is used interchangeably in first component mounter 93, second component mounter 94, and third component mounter 95. Feeder 8 is also used in another component mounting system (not illustrated). The left-right direction in FIG. 1 is an arrangement direction in which multiple feeders 8 are arranged, and the front-rear direction in FIG. 1 is an attaching/detaching direction of feeder 8.

Feeder 8 is assigned with individual identification information and managed. The individual identification information is displayed by a label or the like on which a bar code is printed. Furthermore, a control section (not illustrated) of feeder 8 holds the individual identification information and has a function of transmitting the individual identification information using communication. The reel on which a carrier tape is wound is exchangeably loaded in feeder 8. The carrier tape houses and holds components in respective cavity sections provided side by side in a length direction. As for the information of the type of the component held on the reel, a label on which a bar code is printed is attached to the reel and displayed. The individual identification information and the information of the type of the component may be assigned by using a display location and a display method other than the above.

Component mounting system 9 is provided with feeder storage device 96, line management device 97, and automatic exchanging device 1. Feeder storage device 96 is disposed at the same height as component supply section 9A of component mounters (93, 94, 95) while being adjacent to the left side of solder printer 91. Feeder storage device 96 has multiple slots that extend in the front-rear direction and are formed in parallel with each other at a predetermined pitch, similarly to component supply section 9A. Feeder 8 for which the setup work has been completed and used feeder 8 are attached and stored in the slot of feeder storage device 96. Line management device 97 is disposed adjacent to the left side of feeder storage device 96.

Automatic exchanging device 1 automatically exchanges feeder 8. Specifically, automatic exchanging device 1 exchanges feeder 8 between component supply section 9A and spare feeder storage section 9B of component mounters (93, 94, 95). In addition, automatic exchanging device 1 moves between component mounters (93, 94, 95) and feeder storage device 96, and conveys and exchanges feeder 8.

As illustrated in FIG. 1, automatic exchanging device 1 includes arrangement direction moving section 2, arrangement direction driving device 20, exchange section 3, and the like. Arrangement direction moving section 2 is provided to be movable in the arrangement direction with respect to component mounters (93, 94, 95). Arrangement direction moving section 2 is an oblong box-shaped member having an open rear side. Arrangement direction driving device 20 moves arrangement direction moving section 2 in the arrangement direction. Arrangement direction driving device 20 includes a track section provided on a non-moving side, an engaging section provided on a moving side and movably engaged with the track section, a driving source for generating power for movement, and the like.

Middle-level rail 21 and lower-level rail 22 corresponding to the track section are provided on a front surface of machine table 99 of multiple board work machines and a front surface of feeder storage device 96. Middle-level rail 21 and lower-level rail 22 extend in the arrangement direction. A height position of middle-level rail 21 is integrated between component supply section 9A and spare feeder storage section 9B. A height position of lower-level rail 22 is integrated with the lower side of spare feeder storage section 9B. As a result, multiple middle-level rails 21 and multiple lower-level rails 22 form two track sections which are parallel to each other and extend from feeder storage device 96 to third component mounter 95.

Middle-level traveling section 23 and lower-level traveling section 24, serving as engaging sections, are disposed on the left and right on the rear side of arrangement direction moving section 2. Middle-level traveling section 23 is engaged with middle-level rail 21 in a movable manner, and lower-level traveling section 24 is engaged with lower-level rail 22 in a movable manner. Middle-level traveling section 23 further includes a driving source for generating power for traveling. As a result, arrangement direction moving section 2 is mounted on middle-level rail 21 and lower-level rail 22, and travels and moves in the arrangement direction.

Furthermore, arrangement direction moving section 2 includes non-contact power receiving section 25 at a height position between middle-level traveling section 23 and lower-level traveling section 24, which is a height position that does not hinder exchange of feeder 8. Non-contact power receiving section 25 receives power in a non-contact manner from non-contact power transmission sections provided at a corresponding height on the multiple board work machines. As a result, power supply is performed to arrangement direction driving device 20, exchange section 3, and the like. As a coupling method of non-contact power receiving section 25 and non-contact power transmission section, an electromagnetic coupling method, a capacitive coupling method, or the like is appropriately adopted.

Arrangement direction moving section 2 has lifting/lowering driving section 26 and exchange section 3 inside a box-shaped interior space. Lifting/lowering driving section 26 lifts and lowers exchange section 3 from the height of component supply section 9A to the height of spare feeder storage section 9B. A ball screw feed mechanism is an example of lifting/lowering driving section 26, however the present disclosure is not limited thereto. Exchange section 3 includes a feeder gripping section (not illustrated) on the rear side, and the attachment, detachment, and exchange of feeder 8 are automatically performed.

2. Configuration of Control of Component Mounting System 9

Figure 2:
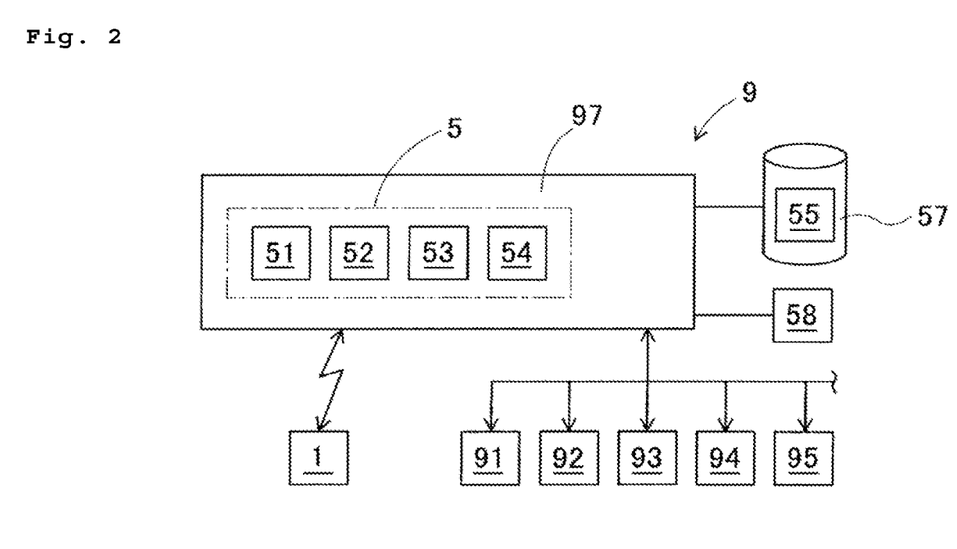
FIG. 2 is a block diagram illustrating a configuration of the component type management device and a configuration of control of the component mounting system according to the embodiment.

Next, a configuration of control of component mounting system 9 will be described. As illustrated in FIG. 2, line management device 97 is configured using a computer device having memory 57, wired communication function, and a wireless communication function. Line management device 97 is connected to a control section (not illustrated) of multiple board work machines using wired communication. Furthermore, line management device 97 is connected to a control section (not illustrated) of automatic exchanging device 1 using wireless communication.

In addition, line management device 97 includes bar code reader 58 operated by an operator. Bar code reader 58 reads the bar code displayed on feeder 8, and acquires the individual identification information of feeder 8. In addition, bar code reader 58 reads a bar code displayed on the reel, and acquires information of the component type. The information acquired by bar code reader 58 is stored in memory 57. In a case where the display method of the individual identification information of feeder 8 and the information of the component type is different from the bar code, a device other than bar code reader 58 is used in association with the display method.

Line management device 97 manages job data describing work contents of board works which are different for each type of board products. Line management device 97 transmits each job data to multiple board work machines based on a production plan. As a result, each of the board work machines performs the board work in accordance with the job data. Furthermore, line management device 97 monitors operation statuses of multiple board work machines.

In addition, line management device 97 issues an exchange command to automatic exchanging device 1 when a mounting work of component mounters (93, 94, 95) progresses and a component shortage occurs in feeder 8. In accordance with the exchange command, first, automatic exchanging device 1 detaches feeder 8 in which the component shortage is occurring from component supply section 9A. As a result, an empty slot is formed in component supply section 9A. Next, automatic exchanging device 1 transports another feeder 8 holding the same type of component as the component that has been used up from spare feeder storage section 9B or feeder storage device 96, and attaches feeder 8 to the empty slot of component supply section 9A.

In addition, line management device 97 issues a setup change command to automatic exchanging device 1 when changing the type of board product to be produced. Automatic exchanging device 1 performs an automatic exchange work of feeder 8 of component mounters (93, 94, 95) in accordance with the setup change command. In many setup change commands, multiple feeders 8 of multiple component mounters (93, 94, 95) are automatically exchanged.

Prior to the exchange command or the setup change command, line management device 97 designates a type of a necessary component based on the production plan, and requests a setup work for loading a reel into feeder 8 outside component mounters (93, 94, 95). The operator performs a setup work in advance in response to the request, and sets feeder 8 for which the setup work has been completed in spare feeder storage section 9B or feeder storage device 96. As a result, the work interruption time of component mounters (93, 94, 95) is shortened when the component shortage occurs.

The control section of component mounters (93, 94, 95) communicates with the control section of feeder 8 attached to component supply section 9A or spare feeder storage section 9B and acquires the individual identification information of feeder 8. In addition, the control section of component mounters (93, 94, 95) recognizes that feeder 8 is attached and detached and is out of the management (attachment/detachment information) based on the availability of communication with feeder 8. The acquired individual identification information and the recognized attachment/detachment information of feeder 8 are transmitted to line management device 97 and shared.

In addition, the control section of automatic exchanging device 1 communicates with the control section of feeder 8 held by exchange section 3 and feeder storage device 96 to acquire the individual identification information of feeder 8. In addition, the control section of automatic exchanging device 1 recognizes that feeder 8 is held and detached and is out of the management (attachment/detachment information) based on the availability of communication with feeder 8. The acquired individual identification information and the recognized attachment/detachment information of feeder 8 are transmitted to line management device 97 and shared.

The control section of component mounters (93, 94, 95) manages attached feeder 8. In a state where feeder 8 is attached to component mounters (93, 94, 95), the exchange work of the reel is not possible. The control section of automatic exchanging device 1 manages feeder 8 held in exchange section 3 or feeder storage device 96. In a state where feeder 8 is held by exchange section 3 or feeder storage device 96, the exchange work of the reel is not possible. Accordingly, in a case of performing the exchange work of the reel, the operator needs to manually detach feeder 8 from component mounters (93, 94, 95) or feeder storage device 96.

3. Configuration of Component Type Management Device 5 According to Embodiment Next, a configuration of component type management device 5 according to the embodiment will be described. As illustrated in FIG. 2, component type management device 5 is realized by software of line management device 97. Component type management device 5 includes association registration section 51, association discarding section 52, detachment discrimination section 53, and association maintaining section 54.

Association registration section 51 registers, in memory 57, association data 55 in which the individual identification information of feeder 8 is associated with the information on the type of the component held in feeder 8. The association of the individual of feeder 8 and the type of component is performed by operating bar code reader 58. That is, the operator operates bar code reader 58 to read the individual identification information of feeder 8 and the information of the type of component displayed on the reel, so that association data 55 is created. Thereafter, the operator loads the reel into feeder 8.

Association discarding section 52 discards association data 55 when a predetermined condition is satisfied after feeder 8 is detached from component mounters (93, 94, 95). Similarly, association discarding section 52 discards association data 55 when a predetermined condition is satisfied after feeder 8 is detached from feeder storage device 96. The predetermined condition is for determining whether there is a possibility that the type (reel) of the component held by feeder 8 is changed. In the present embodiment, the predetermined condition is determined as the elapse of predetermined time T0 (refer to FIG. 3).

That is, while elapsed time TX (refer to FIG. 3) after feeder 8 is detached from component mounters (93, 94, 95) or feeder storage device 96 is shorter than predetermined time T0, it is difficult to complete the reel exchange work, and there is no possibility of changing the type of the component. In addition, when elapsed time TX is equal to or longer than predetermined time T0, there is a possibility that the reel exchange work is performed, and the type of the component is changed. Predetermined time T0 is practically determined to be about several tens of seconds. Predetermined condition may be a condition other than the elapse of predetermined time T0. For example, it may be determined that a predetermined condition is satisfied when feeder 8 is separated from component mounting system 9 by more than a predetermined distance.

Detachment discrimination section 53 discriminates whether feeder 8 is detached by automatic exchanging device 1. Specifically, detachment discrimination section 53 acquires the attachment/detachment information that feeder 8 has been detached from the control section of component mounters (93, 94, 95) and further acquires the individual identification information of detached feeder 8. Next, detachment discrimination section 53 acquires, from the control section of automatic exchanging device 1, attachment/detachment information as to whether exchange section 3 holds feeder 8, and the individual identification information of held feeder 8.

In a case where exchange section 3 does not hold feeder 8, detachment discrimination section 53 discriminates that feeder 8 is not detached by automatic exchanging device 1, in other words, feeder 8 is manually detached. In addition, in a case where the individual identification information of feeder 8 held by exchange section 3 and the individual identification information of feeder 8 detached from component mounters (93, 94, 95) are different from each other, detachment discrimination section 53 discriminates that the detachment is performed manually. In addition, detachment discrimination section 53 acquires the attachment/detachment information in which feeder 8 is manually detached from feeder storage device 96 from the control section of automatic exchanging device 1.

In a case of being discriminated that feeder 8 is detached by automatic exchanging device 1, association maintaining section 54 invalidates the function of association discarding section 52 before the predetermined condition is satisfied, and maintains association data 55. For example, association maintaining section 54 may stop association discarding section 52, or may perform control such that the function of association discarding section 52 is ignored. In addition, association maintaining section 54 continues to invalidate the function of association discarding section 52 while feeder 8 is managed by automatic exchanging device 1. In addition, association maintaining section 54 restores the function of association discarding section 52 when feeder 8 is out of the management of automatic exchanging device 1, in other words, when feeder 8 is manually detached from feeder storage device 96.

Figure 3:
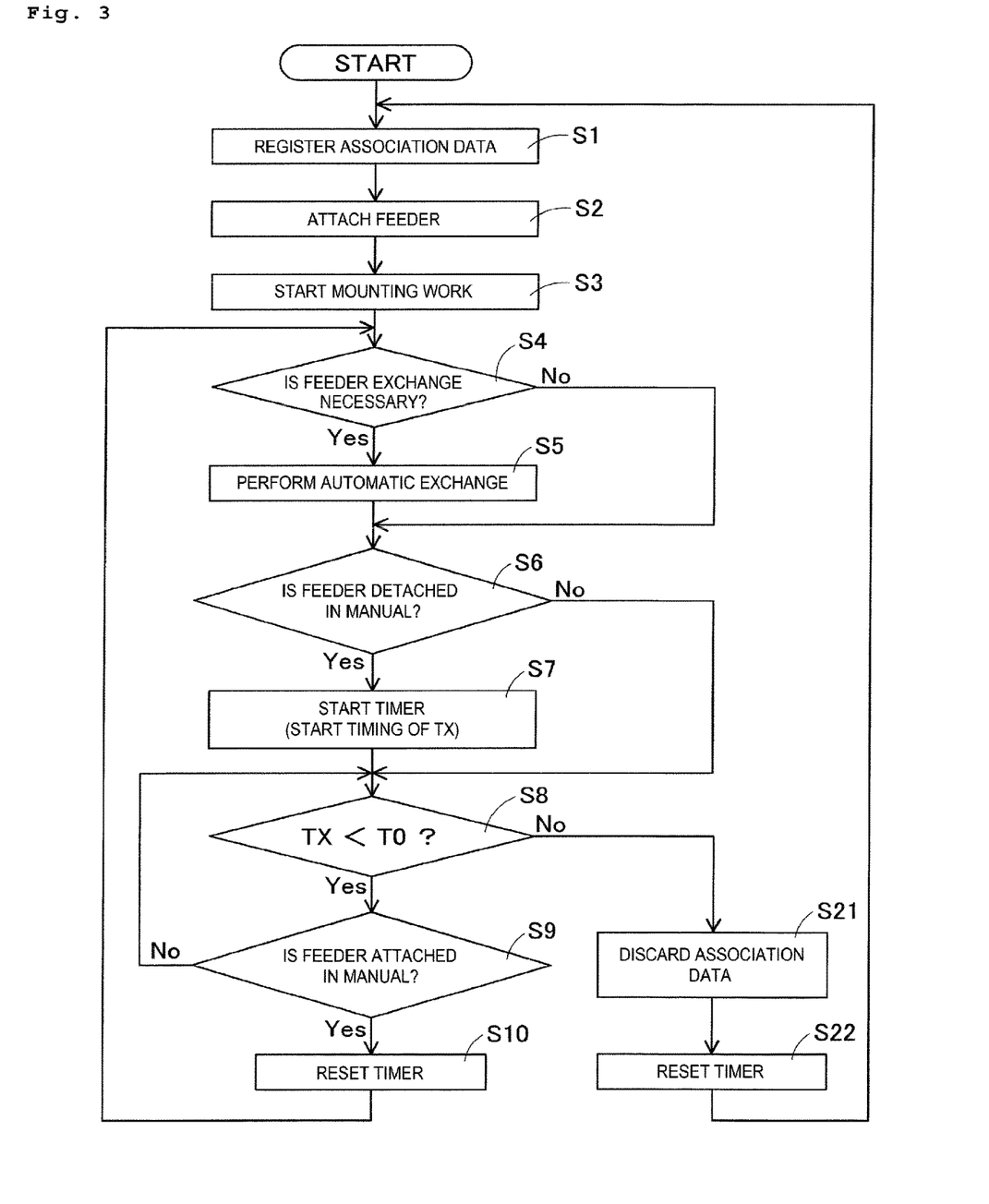
FIG. 3 is a diagram of an operation flow for explaining an operation of the component type management device according to the embodiment.

4. Operation and Action of Component Type Management Device 5 According to Embodiment Next, operations and actions of component type management device 5 according to the embodiment will be described. An operation flow illustrated in FIG. 3 is started at a time when component mounting system 9 starts production of a board product or at a time when the type of the board product is changed, and is repeatedly executed during the production. This operation flow proceeds by the common control of the control sections of component type management device 5 and component mounters (93, 94, 95), and a part of the operation flow proceeds by the setup work of the operator.

In step S1 in FIG. 3, the operator performs a setup work of a type of the component required for a board product to be produced. That is, the operator loads necessary reels into feeder 8. At this time, the individual identification information of feeder 8 and the information of the type of the component held in feeder 8 are associated with each other by the operation of bar code reader 58 described above, so that association data 55 is created. Association registration section 51 registers association data 55 in memory 57. When all types of reels of necessary components are loaded in feeder 8 and all association data 55 are registered, the operation flow proceeds to step S2.

In step S2, the operator attaches setup feeder 8 to component mounters (93, 94, 95). As a result, the setup changing work is completed. In the next step S3, component mounters (93, 94, 95) start the mounting work. Thereafter, the operation flow after step S4 proceeds in parallel with the mounting work. As the mounting work progresses, in step S4, it is determined whether feeder 8 needs to be exchanged. In other words, it is determined whether there is feeder 8 in which a component shortage has occurred or feeder 8 in which the supply of the component becomes unnecessary.

In step S5 in a case where the exchange of feeder 8 is necessary, automatic exchange of feeder 8 is performed by automatic exchanging device 1. Thereafter, automatic exchanging device 1 manages detached feeder 8. At this time, detachment discrimination section 53 can discriminate that feeder 8 has been detached by automatic exchanging device 1. Accordingly, association maintaining section 54 immediately invalidates the function of association discarding section 52. As a result, association data 55 of detached feeder 8 is maintained.

In step S4 in a case where the exchange of feeder 8 is not necessary, and after completion of step S5, the operation flow is merged into step S6. In step S6, detachment discrimination section 53 discriminates whether feeder 8 is manually detached. Manual detachment may occur at three locations: component supply section 9A; spare feeder storage section 9B; and feeder storage device 96. In step S7 in a case where the manual detachment is performed, association discarding section 52 starts a timer, and starts timing of elapsed time TX after the detachment.

In a case where the manual detachment is not performed in step S6, and after completion of step S7, the operation flow is merged into step S8. In step S8, association discarding section 52 determines whether elapsed time TX has reached predetermined time T0. In the first step S8, elapsed time TX has not reached predetermined time T0, and the execution of the operation flow proceeds to step S9.

In step S9, association discarding section 52 discriminates whether feeder 8 is manually attached. In a case where the manual attachment is not performed, the execution of the operation flow is returned to step S4 in a state where the timer is operated. Thereafter, the loop from step S4 to step S9 is repeatedly executed.

When the manual attachment of feeder 8 is performed in the repetition of the loop, the execution of the operation flow proceeds from step S9 to step S10. In step S10, association discarding section 52 resets and stops the timer, and returns the execution of the operation flow to step S4. This means that even if feeder 8 is manually detached, since the reattachment is performed in a short time within predetermined time T0, association data 55 is maintained.

In addition, in the repetition of the loop, when elapsed time TX reaches predetermined time T0, the execution of the operation flow is branched from step S8 to step S21. In step S21, association discarding section 52 discards association data 55 of detached feeder 8. In the next step S22, association discarding section 52 resets and stops the timer, and returns the execution of the operation flow to step S1. Since predetermined time T0 has elapsed after the manual detachment of feeder 8 and there is a possibility that the type (reel) of the component has been exchanged, association data 55 has been discarded.

Regarding feeder 8 for which association data 55 is discarded, regardless of whether the type (reel) of the component is actually exchanged, after association registration section 51 re-registers association data 55 in step S1, reattachment is performed in step S2. In addition, there may be a case where multiple feeders 8 are manually detached. In this case, the timers are individually provided for each of detached feeders 8, association data 55 is managed using individual elapsed time TX.

In component type management device 5 according to the embodiment, detachment discrimination section 53 discriminates whether feeder 8 is detached by automatic exchanging device 1, and in a case where feeder 8 is automatically detached, association maintaining section 54 functions to maintain association data 55. Therefore, it is unnecessary for the operator to re-register association data 55, and there is no possibility of occurrence of an error. In addition, in a case where feeder 8 is manually detached, association discarding section 52 functions to discard association data 55 when predetermined time T0 elapses. Therefore, there is no risk of an error caused by continuing to maintain association data 55 with respect to the possibility that the type (reel) of the component held in feeder 8 is changed. Accordingly, component type management device 5 functions appropriately for both the automatic exchange and the manual exchange of feeder 8, and the type of the component held by feeder 8 can be appropriately managed.

5. Application and Modification According to Embodiment

Component type management device 5 may be realized by using a computer device other than line management device 97. In addition, one of spare feeder storage section 9B and feeder storage device 96 described in the embodiment may be omitted. In addition, component mounting system 9 may be combined with an old-type component mounter capable of only manual exchange work of feeder 8.

Furthermore, component type management device 5 and automatic exchanging device 1 may be provided in common to multiple component mounting systems 9. For example, automatic exchanging device 1 may adopt a configuration including a track from feeder storage device 96 toward multiple component mounting systems 9, and an unmanned conveyance vehicle on which feeder 8 is mounted and travels along the track. Component type management device 5 can manage all feeders 8 used in multiple component mounting systems 9. The present embodiment can be applied and modified in other various forms.

REFERENCE SIGNS LIST

1: automatic exchanging device, 2: arrangement direction moving section, 3: exchange section, 5: component type management device, 51: association registration section, 52: association discarding section, 53: detachment discrimination section, 54: association maintaining section, 55: association data, 58: bar code reader, 8: feeder, 9: component mounting system, 93: first component mounter, 94: second component mounter, 95:

third component mounter, 96: feeder storage device, 97: line management device, 9A: component supply section, 9B: spare feeder storage section, T0: predetermined time, TX: elapsed time.

The invention claimed is:

1. A component type management device comprising:
an association registration section configured to register association data in which individual identification information of a component supply device, which is attached to a component mounter and supplies a component, is associated with a type of the component held in the component supply device;
an association discarding section configured to discard the association data in a case where a predetermined condition is satisfied after the component supply device is detached from the component mounter;
a detachment discrimination section configured to discriminate whether the component supply device is detached by an automatic exchanging device; and
an association maintaining section configured to not discard the association data and maintain the association data when the detachment discrimination section discriminates that the component supply device is a detached component supply device detached by the automatic exchanging device.

2. The component type management device according to claim 1, wherein the predetermined condition is an elapse of a predetermined time.

3. The component type management device according to claim 1,
wherein the automatic exchanging device manages the detached component supply device and does not allow a change of the type of the component held in the managed component supply device, and
the association maintaining section continues to not discard the association data while the component supply device is managed by the automatic exchanging device, and restores discarding the association data by the association discarding section when the component supply device is out of management of the automatic exchanging device.

4. The component type management device according to claim 1, wherein the component supply device is a feeder using a carrier tape in which multiple components are housed.

5. The component type management device according to claim 1, wherein the detachment discrimination section discriminates whether the component supply device is detached by the automatic exchanging device by communicating with the automatic exchanging device and determining that the automatic exchanging device holds the detached component supply device.

* * * * *